US009154147B2

(12) United States Patent
Biallais et al.

(10) Patent No.: US 9,154,147 B2
(45) Date of Patent: Oct. 6, 2015

(54) SYSTEMS AND METHODS FOR ESTIMATION OF OFFSET AND GAIN ERRORS IN A TIME-INTERLEAVED ANALOG-TO-DIGITAL CONVERTER

(71) Applicant: Integrated Device Technology, Inc., San Jose, CA (US)

(72) Inventors: Arnaud Biallais, Goneville sur Mer (FR); Fatima Ghanem, Caen (FR)

(73) Assignee: INTEGRATED DEVICE TECHNOLOGY INC., San Jose, CA (US)

(*) Notice: Subject to any disclaimer, the term of this patent is extended or adjusted under 35 U.S.C. 154(b) by 0 days.

(21) Appl. No.: 14/209,848

(22) Filed: Mar. 13, 2014

(65) Prior Publication Data

US 2014/0266823 A1 Sep. 18, 2014

Related U.S. Application Data

(60) Provisional application No. 61/799,854, filed on Mar. 15, 2013.

(51) Int. Cl.
| | |
|---|---|
| H03M 1/06 | (2006.01) |
| H03M 1/12 | (2006.01) |
| H03M 1/08 | (2006.01) |
| H03M 1/10 | (2006.01) |

(52) U.S. Cl.
CPC .......... *H03M 1/0609* (2013.01); *H03M 1/0607* (2013.01); *H03M 1/08* (2013.01); *H03M 1/109* (2013.01); *H03M 1/121* (2013.01); *H03M 1/1215* (2013.01)

(58) Field of Classification Search
None
See application file for complete search history.

(56) References Cited

U.S. PATENT DOCUMENTS

| | | | | |
|---|---|---|---|---|
| 6,154,158 | A * | 11/2000 | Walker | 341/118 |
| 7,541,952 | B1 * | 6/2009 | Sankaran et al. | 341/118 |
| 8,604,952 | B2 * | 12/2013 | Kidambi et al. | 341/118 |
| 2012/0075129 | A1 * | 3/2012 | Kidambi | 341/118 |

FOREIGN PATENT DOCUMENTS

JP 2004153509 A * 5/2004

OTHER PUBLICATIONS

Dyer, K. et al. An Analog Background Calibration Technique for Time-Interleaved Analog-to-Digital Converters, IEEE Journal of Solid-State Circuits, vol. 33, No. 12, Dec. 1998.*

* cited by examiner

*Primary Examiner* — Howard Williams
(74) *Attorney, Agent, or Firm* — Hayes and Boone LLP

(57) ABSTRACT

The present disclosure relates to the field of background estimation in a time-interleaved analog-to-digital converter (ADC). More specifically, the present disclosure relates to systems and methods for background estimation of offset and gain errors in a time-interleaved ADC based on sample count. The error estimation unit of the time-interleaved ADC system includes a counting unit, a subtractor and an integrator. The method for estimating an offset error in a time-interleaved ADC includes determining signs of the signals and outputting corresponding values by the counting unit. The values are further compared and integrated to estimate the offset error. The method for estimating a gain error in a time-interleaved ADC includes determining the absolute values of the signals and comparing the absolute values with a predetermined threshold value. The comparison results are further integrated to estimate the gain error.

15 Claims, 10 Drawing Sheets

SYSTEMS AND METHODS FOR ESTIMATION OF OFFSET AND GAIN ERRORS IN A TIME-INTERLEAVED ANALOG-TO-DIGITAL CONVERTER

RELATED APPLICATIONS

This application claims priority to U.S. Provisional Application Ser. No. 61/799,854 filed on Mar. 15, 2013, which is herein incorporated by reference in its entirety.

BACKGROUND

1. Technical Field

The present disclosure relates to the field of background estimation in a time-interleaved analog-to-digital converter (ADC). More specifically, the present disclosure relates to systems and methods for background estimation of offset and gain errors in a time-interleaved ADC based on sample count.

2. Discussion of Related Art

A time-interleaved analog-to-digital converter (ADC) is an effective system to increase the sampling frequency of an ADC. A time-interleaved ADC system has a plurality of channels in parallel each one running at a different sampling rate from each other. Environmental variation creates mismatch between channels, which further causes a degradation of the signal-to-noise and distortion ratio (SNDR). Offset and gain errors are two well-known errors in a time-interleaved ADC. Offset mismatch leads to a fixed pattern noise in the global ADC system, while the magnitude of the gain error is modulated by the input frequency (fin).

Classical estimation methods of offset and gain errors are based on the manipulation of the output code of the two channels to extract these errors. Classical cost functions needed to estimate offset and gain errors using operators, such as adders and multipliers, and an integrator to average out the signal and extract the error.

The channel output code size depends on the ADC resolution, and sometimes can be quite large (e.g. between −32768 and 32767 for a 16-bit ADC). This means that the cost function is made of very big operators with input signal size of $2^{res-1}$ (res is the ADC resolution), and an over-sized integrator with up to a few billion of low significant bit (LSB).

Therefore there is a need for a smaller sized and cost efficient system and method to offer better estimation of offset and gain errors in a time-interleaved analog-to-digital converter.

SUMMARY

In accordance with some embodiments, a system is provided herein for estimation of offset and gain errors in a two-channel time-interleaved ADC. The system includes a plurality of digitizer channels; an offset error estimation unit coupled between a first channel and a second channel of the plurality of channels; and a gain error estimation unit coupled between the first channel and the second channel, wherein at least one of the offset error estimation unit and the gain error estimation unit includes a counting unit configured to determine and output first and second values based on first and second signals received from the first and second channels correspondingly.

In accordance with some embodiments, a method for estimating an offset error in a time-interleaved analog-to-digital converter is provided. The method includes receiving first and second signals from first and second channels, determining signs of the first and second signals, outputting first and second values by a counting unit, outputting a third value based on the difference between the first and second values, and integrating the third value with a feedback loop to estimate the offset error.

Additionally, embodiments of a method for estimating a gain error in a time-interleaved analog-to-digital converter are further provided. The method includes receiving first and second signals from first and second channels, determining first and second absolute values, selecting a threshold value, comparing the absolute values with the threshold value, outputting first and second values corresponding to the comparison result between the absolute value and the threshold value by a counting unit, outputting a third value based on the difference between the first and second values, and integrating the third value with a feedback loop to estimate the gain error.

These and other embodiments will be described in further detail below with respect to the following figures.

The drawings may be better understood by reading the following detailed description.

DETAILED DESCRIPTION

Figure 1:
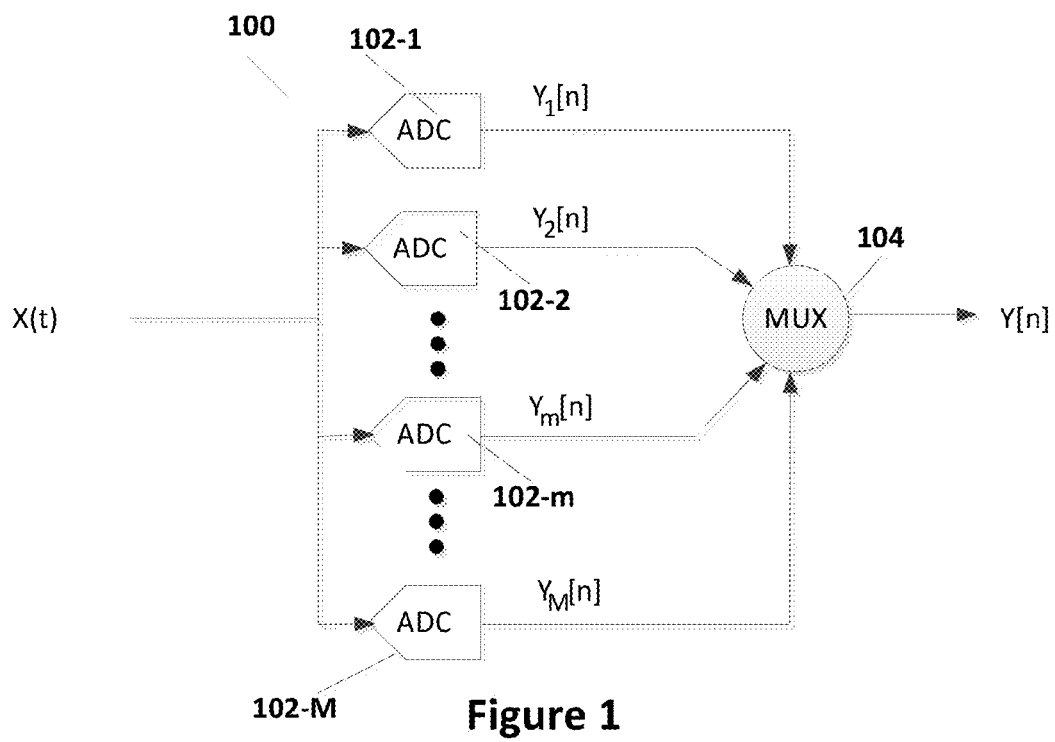
FIG. 1 illustrates a time-interleaved ADC.

FIG. 1 illustrates an example of a time-interleaved analog-to-digital converter (ADC) 100. As shown in FIG. 1, ADC 100 includes M individual channels formed by individual ADCs 102-1 through 102-M. Each of ADCs 102-1 through 102-M sample the input analog signal X(t) at a rate of $f_s/M$. Further, each of ADCs 102-1 through 102-M are phased such that ADC 102-$m$ has a phase of $\Phi=(m-1)(2\pi)/M$. As a result, the phase of ADC 102-1 is 0 and the phase of ADC 102-M is $(M-1)(2\pi)/M$. Consequently, ADC 100 has an overall sampling rate of $f_s$ while each individual ADC 102-m has a lower sampling rate of $f_s/M$.

For example, if ADC 100 is a two channel system, where M=2, the sampling rate of each of ADC 102-1 and 102-2 are each $f_s/2$ while the overall sampling rate of ADC 100 is $f_s$. In a two-channel system, ADC 102-1 can correspond with and be referred to as Channel A and ADC 102-2 can correspond with and be referred to as Channel B. As discussed above, the phase of Channel A is $\Phi=0$ and the phase of Channel B is $\Phi=\pi$.

As is further illustrated in FIG. 1, each of the individual channel outputs $Y_1[n]$ through $Y_M[n]$, corresponding to the digitized output of ADCs 102-1 through 102-M, respectively, are input to multiplexor 104. Multiplexor 104 is driven by the phase of each of the individual channels to select the appropriate digitized output signal to provide as the digitized output $Y[n]$. As an example, in a two-channel system $Y[n]$ is the alternate sampling from Channel A, ADC 102-1, and Channel B, ADC 102-2, timed according to the phases of Channel A and Channel B.

Figure 2A:
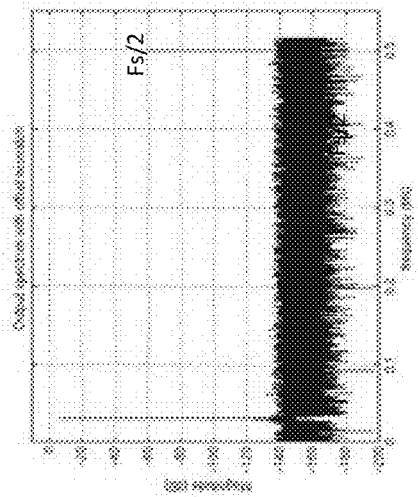
FIG. 2A illustrates an offset error data in a two-channel time-interleaved ADC in time domain according to some embodiments of the present invention.
Figure 2B:
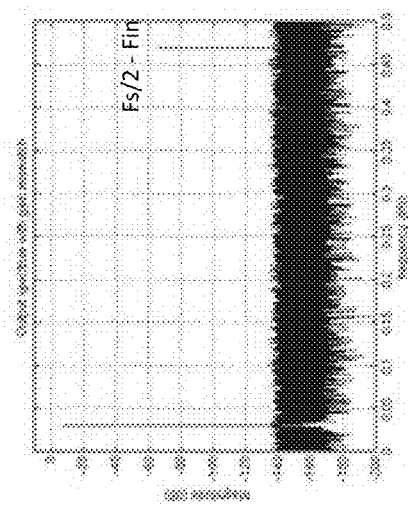
FIG. 2B illustrates an offset error data in a two-channel time-interleaved ADC in frequency domain according to some embodiments of the present invention.
Figure 2C:
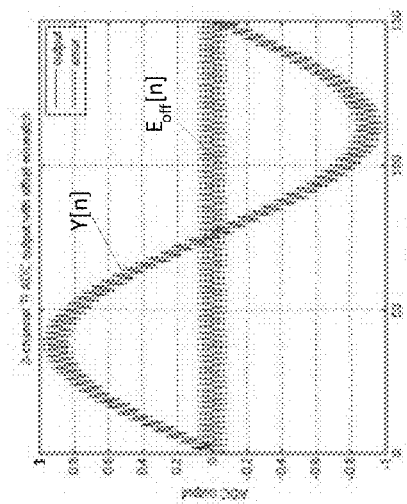
FIG. 2C illustrates a gain error data in a two-channel time-interleaved ADC in time domain according to some embodiments of the present invention.
Figure 2D:
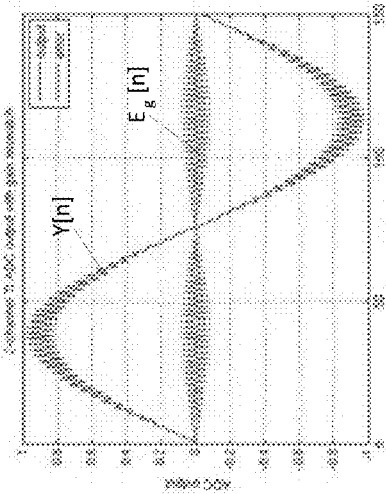
FIG. 2D illustrates a gain error data in a two-channel time-interleaved ADC in frequency domain according to some embodiments of the present invention.

However, environmental variations between individual channels creates mismatch between different channels, which further causes offset and gain errors in a time-interleaved ADC system such as ADC 100. Offset mismatch leads to a fixed pattern noise in the global ADC system, while the magnitude of the gain error is modulated by the input frequency. FIGS. 2A and 2B show the offset errors of an example pair of channels in an ADC in time domain and frequency domain respectively. As shown in FIG. 2A, the output $Y[n]$ carries an error $E_{off}[n]$ that, as is indicated in FIG. 2B, includes a fixed frequency noise. FIGS. 2C-2D show the gain errors effect in a pair of channels in an ADC in time domain and frequency domain respectively. As shown in FIG. 2C, the output $Y[n]$ includes an error $E_g[n]$. As shown in FIG. 2D, the output spectrum of the error $E_g[n]$ is modulated by the input frequency $f_{in}$.

Figure 3A:
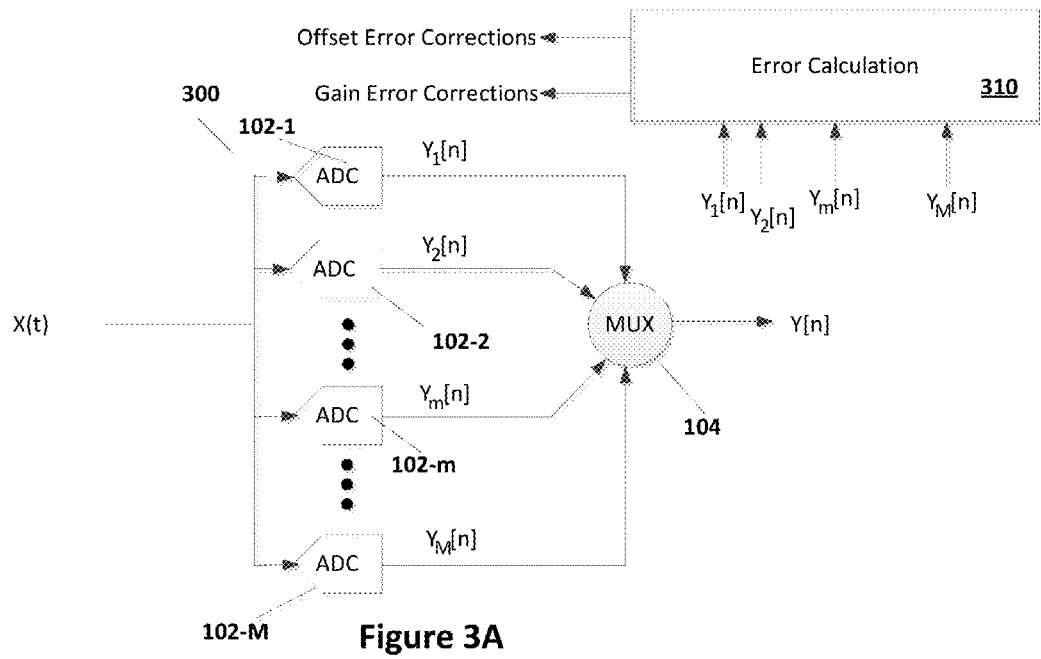
FIGS. 3A and 3B illustrate a time-interleaved ADC according to some embodiments of the present invention.

FIG. 3A illustrates a time-interleaved ADC 300 according to some embodiments of the present invention. As shown in FIG. 3A, each of the digitized values $Y_1[n]$ through $Y_M[n]$ are input to error calculation 310 for processing. Error calculation 310 outputs offset errors and a gain errors for each of ADCs 102-1 through 102-M that corrects the relative offset and gain errors between individual ones of ADCs 102-1 through 102-M. Error calculation 310 can include processors that execute instructions stored in a memory to processes the digitized values $Y_1[n]$ through $Y_M[n]$. Error calculation 310 may also be formed entirely, or partially with a processor, of "hard-wired" digital circuitry that processes the digitized values $Y_1[n]$ through $Y_M[n]$ according to embodiments as described below.

Figure 3B:
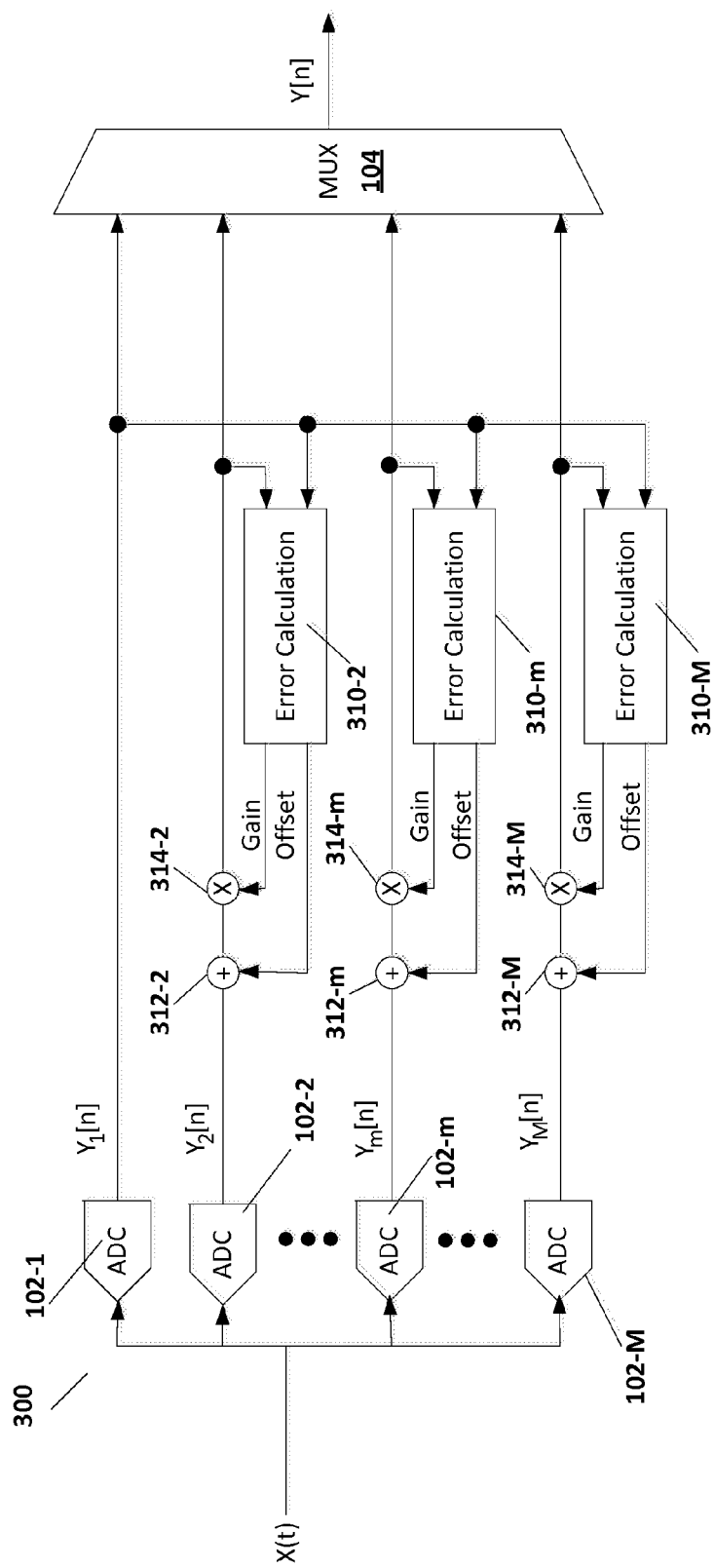

FIG. 3A illustrates a particular example of an ADC 300 according to some embodiments of the present invention. As illustrated in FIG. 3B, error calculation 310 includes error calculation 310-2 through 310-M. Each of error calculation 310-2 through 310-M, in the particular example illustrated in FIG. 3B, calculates the offset error and the relative gain error between ADC 102-1 and ADC 102-2 through 102-M, respectively. In that case, each of the output signals $Y_2[n]$ through $Y_M[n]$ from ADCs 102-2 through 102-M, respectively, can be adjusted relative to the output signal $Y_1[n]$. As shown in FIG. 3B, error calculation 310-2 through 310-M input $Y_2[n]$ through $Y_M[n]$, respectively, and also input $Y_1[n]$. As is further shown in FIG. 3B, error calculation 310-2 through 310-M output a gain correction to multiplier 314-2 through 314-M, respectively, and an offset correction to adder 312-2 through 312-M, respectively. Adder 312-2 through 312-M add the value $Y_2[n]$ through $Y_M[n]$, respectively, to the offset correction from error calculation 310-2 through 310-M, respectively. Multiplier 314-2 through 314-M multiply the output signal from adder 312-2 through 312-M, respectively, by the gain correction from error calculation 310-2 through 310-M, respectively.

FIG. 3B illustrate an example ADC 300 where ADCs 102-2 through 102-M are corrected with respect to ADC 102-1. However, in general any one of ADCs 102-1 through 102-M can be used as a reference ADC while all of the other ones of ADCs 102-1 through 102-M are corrected with respect to the reference ADC.

Figure 4:
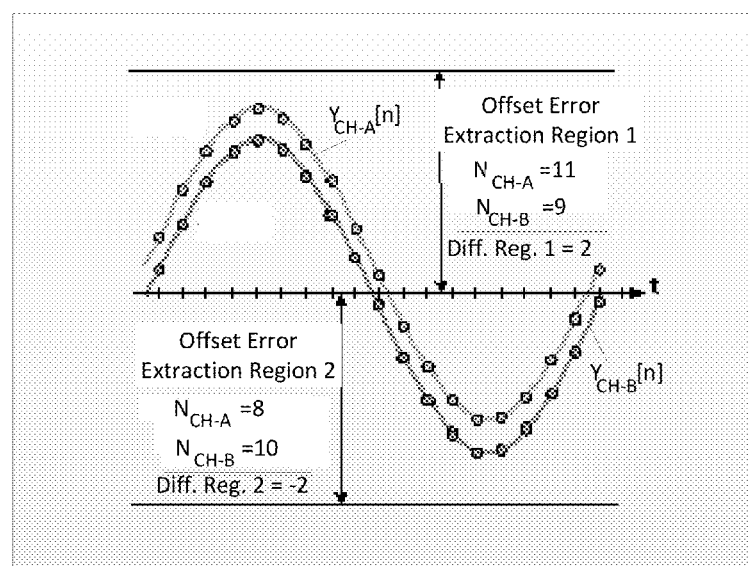
FIG. 4 shows an example of estimating the offset error according to some embodiments of the present invention.

FIG. 4 shows an example estimate of the offset error between two channels in a time interleaved ADC 300 according to some embodiments of the present invention. The different number of positive data points between channel A, for example ADC 102-1, and channel B, for example ADC 102-m, and the different number of negative data points between channel A and channel B are compared to obtain an offset value. Therefore, the offset value=$[N(y_{chA}>0)-N(y_{chB}>0)]-[N(y_{chA}<0)-N(y_{chB}<0)]$, where $N(y_{chA}>0)$ and $N(y_{chB}>0)$ represent the number of positive data points from channel A and channel B respectively, and where $N(y_{chA}<0)$ and $N(y_{chB}<0)$ represent the number of negative data points from channel A and channel B respectively.

As a particular example, as illustrated in FIG. 4, in extraction region 1 where the data points are positive, there are 11 positive data points from channel A and 9 positive data points from channel B. In extraction region 2 where the data points are negative, there are 8 negative data points from channel A and 10 negative data points from channel B. As a result, the offset value according to the above equation is (Diff. Reg. 1–Diff. Reg. 2)=4. The offset value calculated, then, is a positive value. Therefore for channel A, the number of positive data may be greater, while for channel B, the number of negative data may be greater. Since Diff. Reg. 1–Diff. Reg. 2 is greater than 0, channel B should be shifted in a positive direction and a predetermined shift value can be output as the offset correction. For example, the predetermined shift value can be set to one least-significant-bit of the ADC. As a result of multiple iterations of the process, Channel A and Channel B will align and experience little to no shift.

Figure 5:
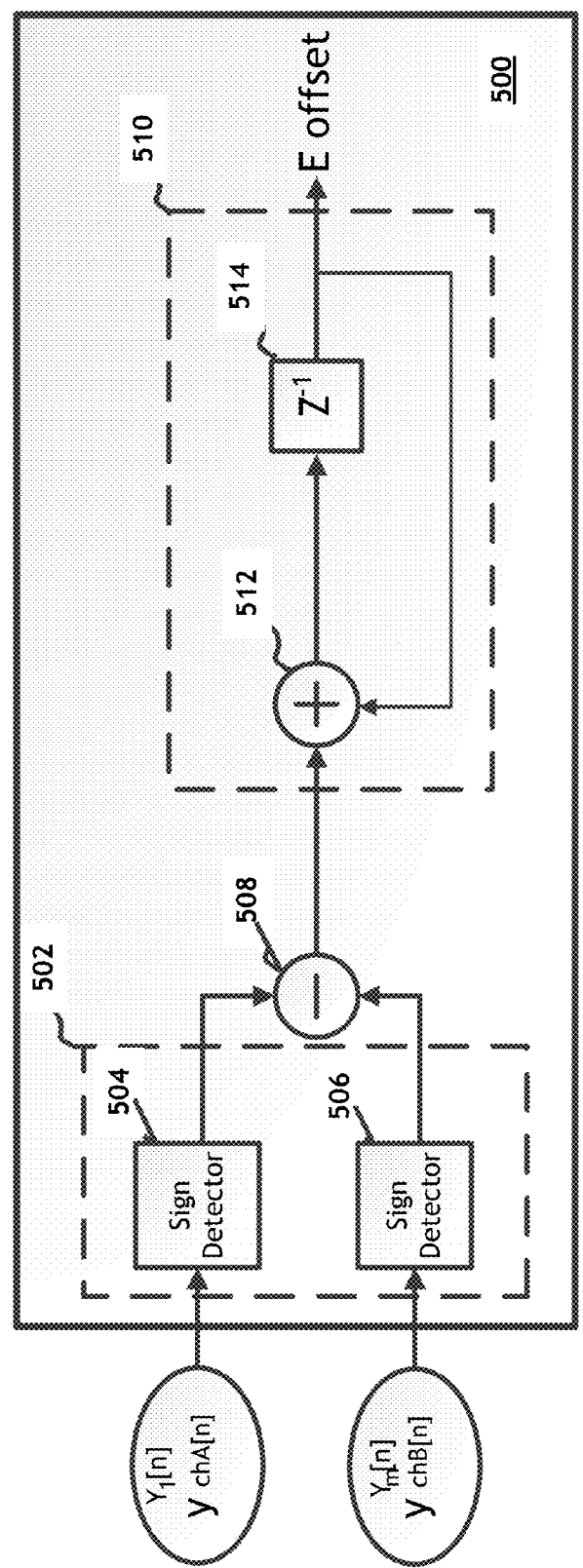
FIG. 5 is a diagram illustrating an offset error estimation unit configured to estimate the offset error according to some embodiments of the present invention.

FIG. 5 is a diagram illustrating an offset error estimation unit 500 that is included in error calculator 310 that is configured to estimate the offset error of a two-channel ADC 300 according to some embodiments of the present invention. As shown in FIG. 5, the offset error estimation unit 500 includes sign detector block 502. In sign detector block 502, a sign detector 504 is coupled to channel A to receive the digitized signal $y_{CH-A}[n]$ (corresponding with $Y_1[n]$ of FIG. 3) and determines if the output signal $y_{CH-A}[n]$ from channel A is positive or negative. Similarly, a sign detector 506 in sign detector block 502 may be coupled to channel B to determine if the output signal $y_{CH-B}[n]$ (corresponding with $Y_m[n]$ of FIG. 3) from channel B in the two-channel time-interleaved ADC is positive or negative. In both sign detector 504 and sign detector 506, if the input data point of the channel output signal ($y_{CH-A}[n]$ or $y_{CH-B}[n]$) is positive, the corresponding sign detector 504 or 506 is configured to output +1. Conversely, if the input data point is negative, the sign detector 504 or 506 is configured to output −1. The output signals from sign detectors 504 and 506 are input to subtractor 508, which calculates the value $\text{SIGN}(y_{CH-A}[n])-\text{SIGN}(y_{CH-B}[n])$. Subtractor 508 is coupled to an integrator 510 to integrate the difference to estimate the offset error $E_{offset}$. In some embodiments, as shown in FIG. 5, integrator 510 may include an adder 512 and a delay register 514, where the new value from subtractor 508 is added to the output of delay register 514. One skilled in the art will recognize that error estimation unit 500 calculates the offset error as defined above. The value $E_{offset}$ calculated by offset error estimation unit 500 can be used to generate an offset correction. For example, if the value $E_{offset}$ is positive, then the offset correction can be increased by one least-significant-bit (LSB) and if the value $E_{offset}$ is negative the offset correction can be decreased by one LSB.

Figure 6:
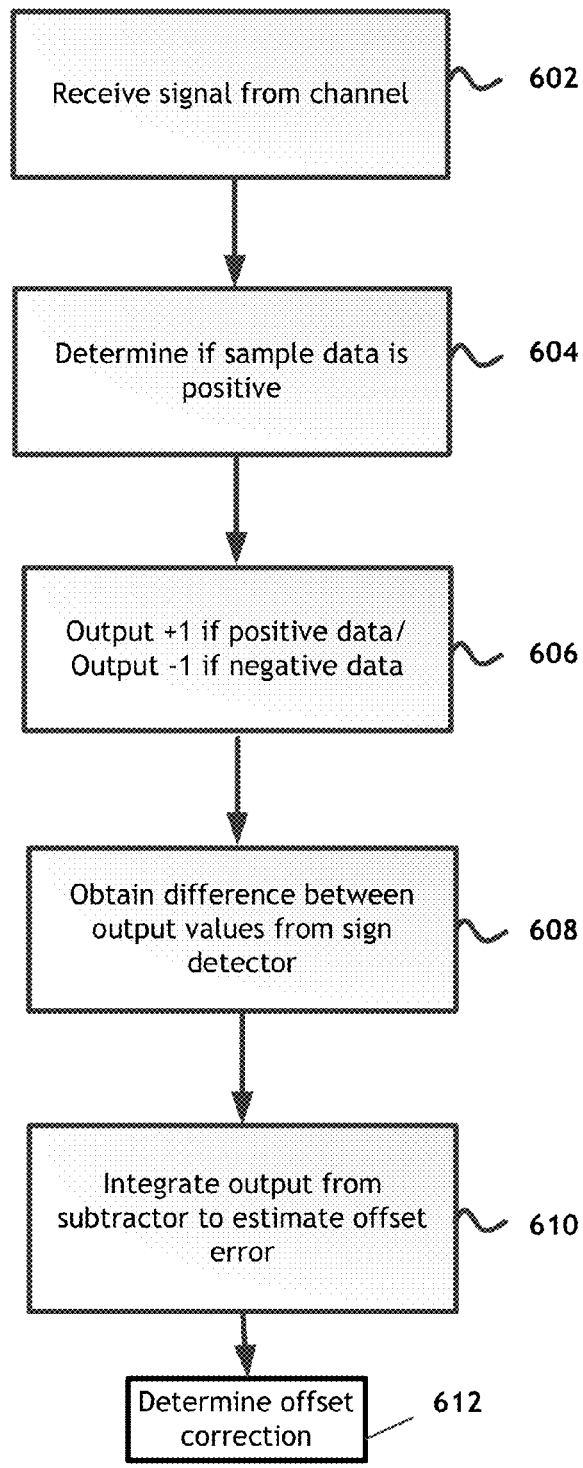
FIG. 6 is a flowchart illustrating a method for estimating the offset error according to some embodiments of the present invention.

FIG. 6 is a flowchart illustrating a method for estimating the offset error according to some embodiments of the present invention. For the purposes of illustration, the flowchart of FIG. 6 will be described in conjunction with FIG. 5. After receiving the digitized data points $y_{chA}$ and $y_{chB}$ from channel A (ADC 102-1) and channel B (ADC 102-2) respectively in step 602, the sign detectors 504 and 506 (as shown in FIG. 5) determines if each of the data points is positive in step 604. As illustrated in step 606, sign detectors 504 and 506 output +1 if the data point is positive and a −1 if the data point is negative. In step 608, the subtractor 508 calculates the difference of the output signals from sign detectors 504 and 506. The difference obtained by subtractor 508 is then integrated in an integrator 510 to estimate the offset error $E_{offset}$ as shown in step 610. As shown in step 612, the value of the offset error $E_{offset}$ is used to determine an offset correction. For example, offset correction can be increased if $E_{offset}$ is positive and decreased if $E_{offset}$ is negative.

Figure 7:
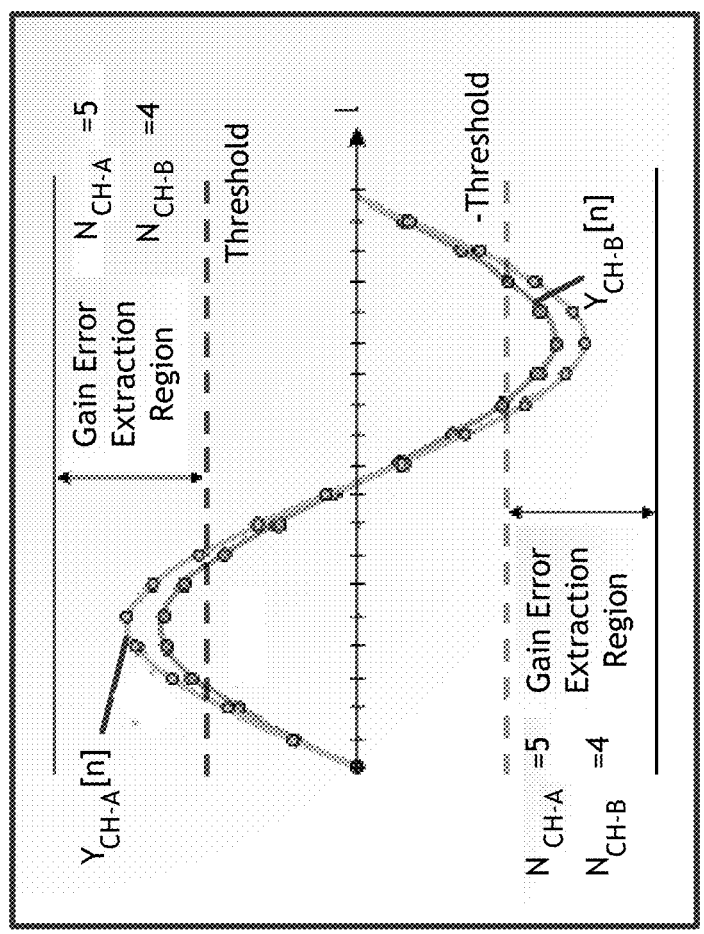
FIG. 7 shows an example of estimating the gain error according to some embodiments of the present invention.
Figure 8:
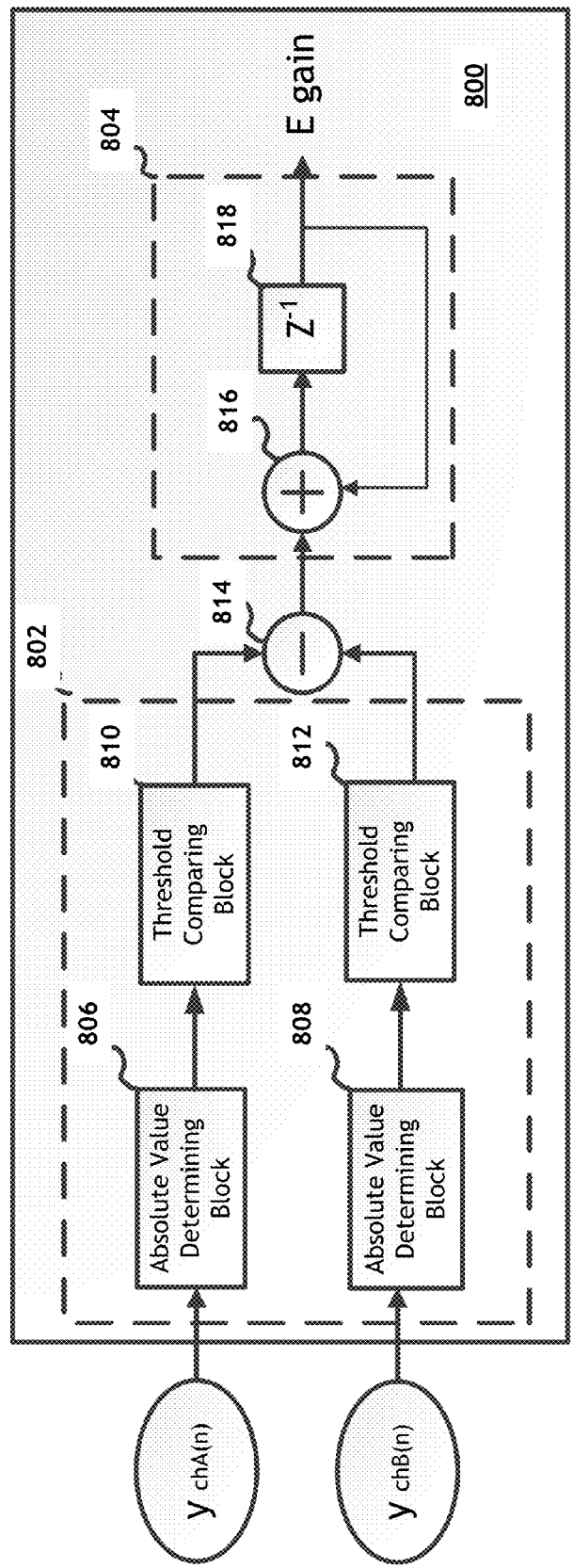
FIG. 8 is a diagram illustrating a gain error estimation unit configured to estimate the gain error according to some embodiments of the present invention.

In addition to an offset error calculation, error calculation 310 can also include a gain error calculation. FIG. 7 shows an example of estimating the gain error according to some embodiments of the present invention. A threshold value is determined, and the number of the data points that have higher absolute value than the threshold value may be counted. If there are more data points that have bigger value than the threshold, a positive gain error is obtained. If there are more data points that have smaller value than the threshold, a negative gain error is obtained. Gain error between channels may be obtained by comparing the number of data points that are greater than the threshold from channel A to that from channel B. In an embodiment as shown in FIG. 7, there are 5 data points from channel A that are larger than the determined threshold value, and there are 4 data points from channel B that are larger than the determined threshold hold. Therefore in FIG. 7, the gain is greater on channel A than on channel B and the gain error, determined by $N_{CH-A}-N_{CH-B}$. Again, the gain correction can be determined by the gain error and can be increased if the gain error is positive and decreased if the gain error is negative. FIG. 8 is a diagram illustrating a gain error estimation unit 800, which can be included in error calculation 310. Gain error estimation unit 800 is configured to estimate the gain error $E_{gain}$ according to some embodiments of the present invention. As shown in FIG. 8, gain error estimation unit 800 includes an over-threshold determination block 802, a subtractor 814, and an integrator 804. Over-threshold determination block 802 determines whether the absolute values of the input data $y_{CH-A}[n]$ and $y_{CH-B}[n]$ are over a threshold value, as shown in FIG. 7. For each channel, block 802 outputs a 1 if the input data is over the threshold and a 0 if the input data is under the threshold. The output is input to subtractor 814, wherein the determination for channel B is subtracted from the determination for Channel A. The result from subtractor 814 is integrated in integrator 804 to arrive at the gain error $E_{gain}$.

As shown in FIG. 8, block 802 includes absolute value determining block 806 that receives the digital data $y_{CH-A}[n]$ and outputs the absolute value $|y_{CH-A}[n]|$ and includes absolute value determining block 808 that receives the digital data $y_{CH-B}[n]$ and outputs the absolute value $|y_{CH-B}[n]|$. The output from absolute value determining block 806 and absolute value determining block 808 are input to threshold compare block 810 and threshold comparing block 812, respectively. Therefore, threshold comparing block 810 outputs a "1" if $|y_{CH-A}[n]|>$Threshold and outputs a "0" if $|y_{CH-A}[n]|<$Threshold. Similarly, threshold comparing block 812 outputs a "1" if $|y_{CH-B}[n]|>$Threshold and outputs a "0" if $|y_{CH-B}[n]|<0$. The output from threshold comparing block 812 is then subtracted from the output from threshold comparing block 810 in subtractor 814. The subtractor 814 is coupled to integrator 804 to integrate the difference calculated by subtractor 814 and estimate the gain error $E_{gain}$. In some embodiments, the integrator 814 can include an adder 816 and a delay register 818 supplying a delayed signal to adder 816. In some embodiments, if $E_{gain}$ is positive than a gain correction value is increased and if $E_{gain}$ is negative the gain correction value is decreased.

Figure 9:
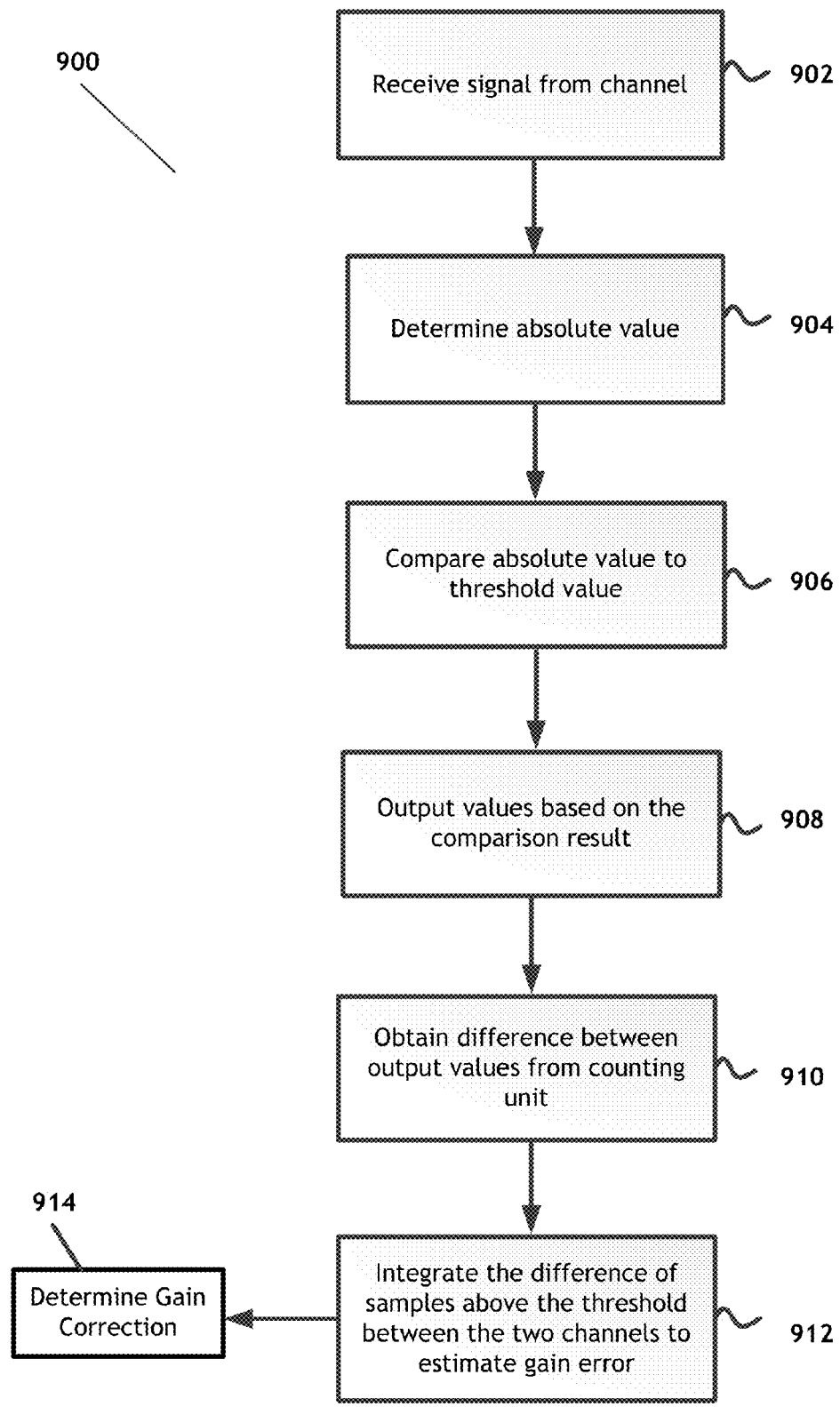
FIG. 9 is a flowchart illustrating a method for estimating the gain error according to some embodiments of the present invention.

FIG. 9 is a flowchart illustrating a method 900 for estimating the gain error according to some embodiments of the present invention. For the purposes of illustration, the flowchart of FIG. 9 will be described in conjunction with the block diagram shown in FIG. 8. After receiving the output signals $y_{CH-A}[n]$ and $y_{CH-B}[n]$ from channel A and channel B respectively in step 902, the absolute value of each signal is determined by the absolute value determining blocks 806 and 808 in step 904. In some embodiments, the absolute value of each signal is determined using the sign bit of each sample $y_{CH-A}[n]$ and $y_{CH-B}[n]$. If the sign bit is equal to 0, the data point is not negative and the absolute value equals the original value of the data point. If the sign bit is 1, the data point is negative and the absolute value equals the inverted value of the originally negative data point.

The absolute value of each data point is then compared to a predetermined threshold value as shown in step 906. If the absolute value is bigger than the predetermined threshold value, the threshold comparing block 906 outputs 1, whereas if the absolute value is smaller than the predetermined threshold value, the threshold comparing block 906 outputs 0, as shown in step 908. In step 910, the subtractor 814 calculates the difference of the output values from channel A and channel B. The difference obtained by subtractor 814 is further integrated by integrator 804 to estimate the gain error as shown in step 408. As the input to integrator 804 is either −1, 0 or +1, the integrator size may be small. In step 914, the gain correction is determine from the gain error $E_{gain}$. For example, if the gain error $E_{gain}$ is positive, the gain correction may be increased and if the gain error $E_{gain}$ is negative, the gain correction may be decreased. The increase or decrease of the gain error may be a small percentage of the nominal gain of ADCs 102.

Figure 10:
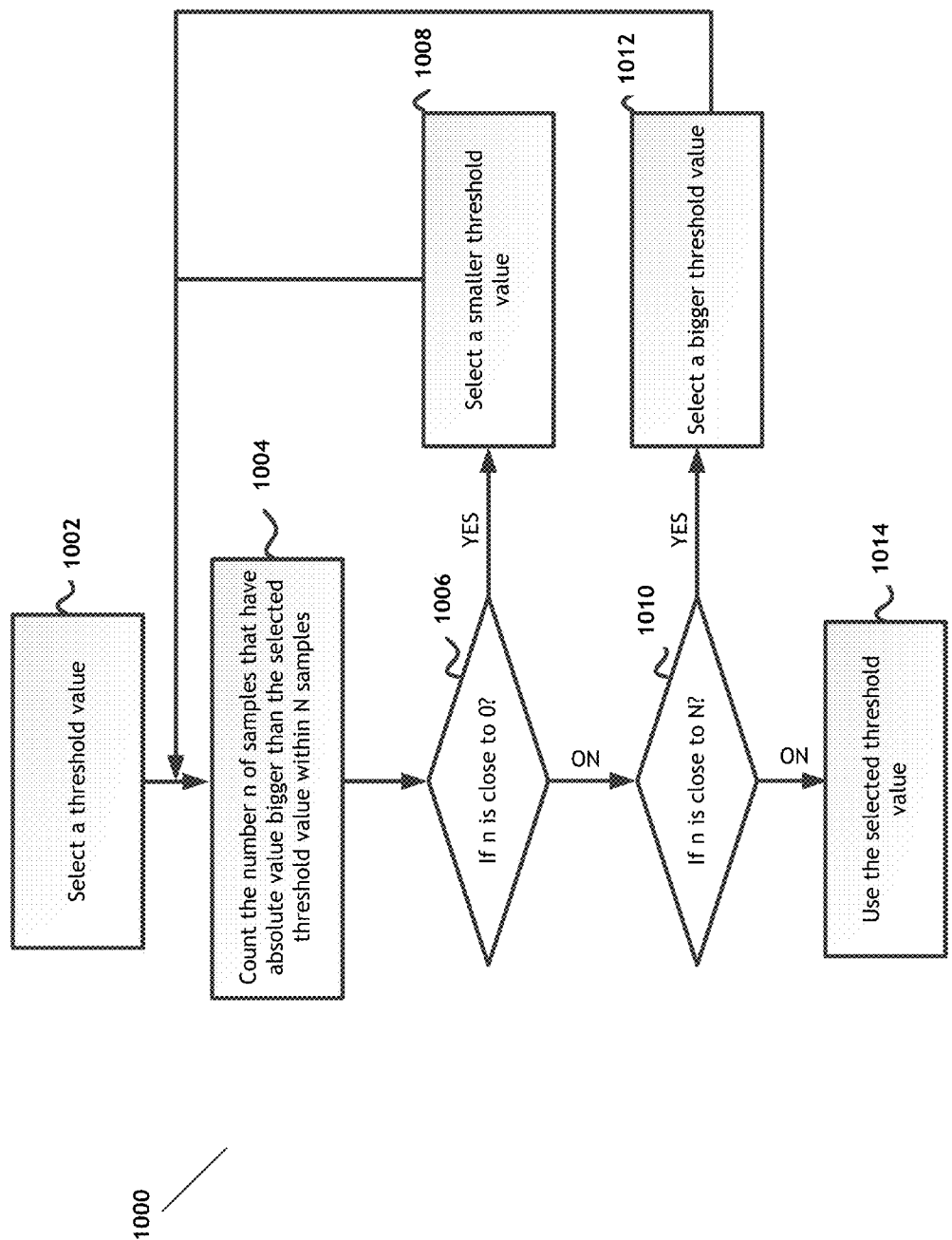
FIG. 10 is a flowchart illustrating the method for selecting a predetermined threshold value according to some embodiments of the present invention.

FIG. 10 is a flowchart illustrating the method 1000 for selecting a predetermined threshold value according to some embodiments of the present invention. The threshold value may be selected to provide enough data that have absolute value bigger than the selected threshold value, as well as to provide acceptable convergence time after the comparison with the absolute value of the sample as shown in step 906 in FIG. 9. In some embodiments of the present invention, a dynamic threshold value can be selected based on the instantaneous signal amplitude. As shown in FIG. 10, after a threshold value is selected in step 1002, a number n of samples having absolute value bigger than the selected threshold value is counted within N samples as shown in step 1004. In some embodiments, the number n is compared with 0 as shown in step 1006. If the number n is close to 0 (e.g., within about 20% of N), a smaller threshold value may be selected in step 1008 and N samples are compared with the selected smaller threshold value again as shown in step 1004. If the number n is not close to 0, the number n may be further compared to the number N as shown in step 1010. If the number n is close to N (for example about 80% of N), a bigger threshold value may be selected in step 1012 and N samples are compared with the selected bigger threshold value again as shown in step 1004. If the number n is not close to N, the threshold value is selected as the predetermined threshold value in step 1004. The systems and methods disclosed and claimed in the present invention may be applied in a multi-channel time-interleaved ADC.

The systems and methods for estimation of offset and the gain errors disclosed in the present invention are based on a comparison of the digital code from each channel to a certain value. In some embodiments of the present invention, the output of the subtractors may be −1, 0 or +1, which is then integrated to average out the signal and extract the error. The integrator, which takes advantage of having −1, 0 or +1 for input may be provided with a small size and efficient cost.

In the detailed description above, specific details have been set forth describing certain embodiments. It will be apparent, however, to one skilled in the art that the disclosed embodiments may be practiced without some or all of these specific details. The specific embodiments presented are meant to be illustrative but not limiting. One skilled in the art may recognize other system or method that, although not specifically described herein, is still within the scope and spirit of this disclosure.

What is claimed is:

1. A time-interleaved analog-to-digital converter system comprising:
   a plurality of digitizer channels;
   an offset error estimation unit coupled between a first channel and a second channel of the plurality of channels, the offset error estimation unit including a subtractor that determines a difference between a sign of a first signal from the first channel and a sign of a second signal of the second channel and an integrator coupled to integrate the difference and provide an offset error; and
   a gain error estimation unit coupled between the first channel and the second channel.

2. The system of claim 1, wherein
   the subtractor is coupled to a counting unit and configured to output the difference based on the comparison between first and second values outputted from the counting unit; and
   the integrator coupled to the subtractor is configured to integrate the difference outputted from the subtractor with a feedback loop to estimate the offset error.

3. The system of claim 2, wherein the counting unit includes first and second sign detectors, the first sign detector coupled to the first channel and configured to determine and output the first value corresponding to a first signal received from the first channel, the second sign detector coupled to the second channel and configured to determine and output the second value corresponding to a second signal received from the second channel.

4. The system of claim 3, wherein the integrator comprises:
   an adder coupled to the output of the subtractor to receive the difference and configured to sum the difference outputted from the subtractor; and
   a delay register coupled to the adder and configured to form the feedback loop with the adder.

5. The system of claim 3, wherein one of the first and second values is given +1 if the corresponding signal is positive, and
   wherein one of the first and second values is given −1 if the corresponding signal is negative.

6. The system of claim 1, wherein the gain error estimation unit comprises:
   a second subtractor coupled to a second counting unit and configured to output a second difference based on a comparison between third and fourth values outputted from the second counting unit; and
   a second integrator coupled to the second subtractor and configured to integrate the second difference outputted from the second subtractor with a second feedback loop to estimate a gain error.

7. The system of claim 6, wherein the counting unit comprises:
   first and second absolute value determining blocks, the first absolute value determining block coupled to the first channel and configured to determine a first absolute value of the first signal, the second absolute value determining block coupled to the second channel and configured to determine a second absolute value of the second signal; and
   first and second threshold comparing blocks, the first threshold comparing block coupled to the first absolute value determining block and configured to compare the first absolute value with a predetermined threshold value, the second threshold comparing block coupled to the second absolute value determining block and configured to compare the second absolute value with the predetermined threshold value.

8. The system of claim 7, wherein the absolute value is the same with original signal value if the signal is positive, and
   wherein the absolute value is the inverted value of the original signal values if the signal is negative.

9. The system of claim 6, wherein the second integrator comprises:
   a second adder coupled to the output of the second subtractor and configured to sum the second difference outputted from the second subtractor; and
   a second delay register coupled to the second adder and configured to form the second feedback loop with the second adder.

10. A method for estimating an offset error in a time-interleaved analog-to-digital converter, the method comprising:
    receiving first and second signals from first and second channels respectively;
    determining signs of the first and second signals;
    outputting first and second values corresponding to the signs of the first and second signals by a counting unit;
    outputting a third value based on the difference between the first and second values; and
    integrating the third value with a feedback loop to estimate the offset error.

11. The method of claim 10, wherein one of the first and second values is given +1 if the corresponding signal is positive, and
    wherein one of the first and second values is given −1 if the corresponding signal is negative.

12. A method for estimating a gain error in a time-interleaved analog-to-digital converter, the method comprising:
    receiving first and second signals from first and second channels respectively;
    determining first and second absolute values corresponding to signs of the first and second signals;
    determining a threshold value;
    comparing the first and second absolute values with the threshold value;

outputting first and second values corresponding to the comparison result between the absolute values and the threshold value by a counting unit;

outputting a third value based on the difference between the first and second values; and integrating the third value with a feedback loop to estimate the gain error.

13. The method of claim 12, wherein the absolute value is the same with original signal value if the signal is positive, and wherein the absolute value is the inverted value of the original signal value if the signal is negative.

14. The method of claim 12, wherein determining a threshold value includes:

selecting a threshold value;

comparing the selected threshold value with the absolute value within N samples;

counting the number of samples n having absolute value bigger than the selected threshold value;

decreasing the selected threshold value if the number n is close to 0; and increasing the selected threshold value if the number n is close to N.

15. The method of claim 12, wherein one of the first and second values is given 1 if the corresponding absolute value is bigger than the threshold value, and, wherein one of the first and second values is given 0 if the corresponding absolute value is smaller than the threshold value.

* * * * *